United States Patent [19]

Mayer

[11] 4,432,635

[45] Feb. 21, 1984

[54] TEMPERATURE-CONTROLLED SUPPORT FOR SEMICONDUCTOR WAFER

[75] Inventor: Herbert E. Mayer, Eschen, Liechtenstein

[73] Assignee: Censor Patent-und Versuchs-Anstalt, Vaduz, Liechtenstein

[21] Appl. No.: 363,860

[22] Filed: Mar. 31, 1982

Related U.S. Application Data

[63] Continuation-in-part of Ser. No. 188,539, Sep. 18, 1980, and a continuation-in-part of Ser. No. 220,451, Dec. 29, 1980.

[30] Foreign Application Priority Data

Dec. 20, 1979 [DE] Fed. Rep. of Germany ....... 2951454

[51] Int. Cl.³ .............................................. G03B 27/52
[52] U.S. Cl. .................................................. 355/30
[58] Field of Search .......................................... 355/30

[56] References Cited

U.S. PATENT DOCUMENTS 4,202,623 5/1980 Watkin .................................. 355/30

Primary Examiner—Monroe H. Hayes
Attorney, Agent, or Firm—Karl F. Ross

[57] ABSTRACT

A support for a semiconductor wafer about to be subjected to exposure through a photomask, e.g. a rotatable chuck, comprises a stage to which the wafer is temporarily adhered by suction and whose temperature is controlled by an array of Peltier elements responsive to a thermoelectric sensor disposed close to the wafer-carrying stage surface. The Peltier elements are horizontally arrayed in a rectangular block inserted between the stage and an underlying base of the support, the block being cemented into a metal frame which has only limited contact with the stage and the base to minimize heat conduction therebetween. The base has channels for the circulation of a temperature-modifying fluid such as water.

7 Claims, 8 Drawing Figures

TEMPERATURE-CONTROLLED SUPPORT FOR SEMICONDUCTOR WAFER

CROSS-REFERENCE TO RELATED APPLICATION

This application is a continuation-in-part of 06/88,539 filed Sept. 18, 1980 and a continuation-in-part of Ser. No. 220,451 filed Dec. 29, 1980.

FIELD OF THE INVENTION

My present invention relates to a support for a semiconductor wafer, e.g. a silicon disk, in an apparatus in which that wafer is to be subjected to exposure through a photomask.

BACKGROUND OF THE INVENTION

In the manufacture of printed circuitry it is customary to provide a surface of a silicon wafer with a photoresist film which is then illuminated through a suitable mask in order to form a pattern of exposed and unexposed areas on an underlying oxide layer, either the exposed or the unexposed portions being thereafter chemically removed to enable a selective etching of the oxide layer. In many instances the same pattern is repetitively projected onto different parts of tthe wafer for the mass production of identical chips. A precise alignment of the wafer parts to be illuminated with the mask carried by an overlying holder is essential; for this purpose the apparatus may include a prepositioning station in which its support, usually designed as a rotatable chuck, is displaceable with the aid of certain markings on the wafer for proper orientation before that wafer is transferred to an exposure station. In the system described in my above-identified copending application, such prealignment is achieved by training several beams of parallel light rays onto a noncircular segment of the wafer edge and measuring the intensity of the beam portions not intercepted by the wafer to determine the proper angular position; some of the rays in the intercepted beam portions fall upon marks spaced inward from the wafer periphery whose reflections are used for a more precise alignment.

When the properly oriented wafer is subsequently moved from the prepositioning station to another stage in the exposure station, its temperature should substantially match that of the exposure stage, because dimensional changes due to variations of the wafer temperature may distort the pattern projected upon the photoresist film through the photomask. Conventional wisdom is to maintain a substantially uniform temperature throughout the apparatus, including the exposure stage, the mask holder and the intervening structure, as by the circulation of heating or cooling air. If, however, the temperature equilibrium of such a system is disturbed it takes considerable time to re-establish it.

On the other hand it has been proposed by Ernst W. Löbach (VLSI Wafer Printing with Step- and Repeat Aligners, presented at IGC Conference, Amsterdam, Sept. 19-21 1979) to control the temperature of the wafer independently thereby offsetting variations in the temperature of other components. No indication has been given, however, what means could be used to increase and particularly to decrease the temperature of the wafer within a short interval.

OBJECT OF THE INVENTION

The object of my present invention, therefore, is to provide means for effectively stabilizing the temperature of the wafer at a desired level.

SUMMARY OF THE INVENTION

In accordance with my present invention, and as already disclosed (but not claimed) in my copending application, a support having a stage with a wafer-carrying upper surface—onto which the wafer is held by suction as is well known per se—comprises temperature-sensing means adjacent that surface and Peltier-effect temperature-control means below the stage responsive to the temperature-sensing means for maintaining the wafer at a selected temperature level.

Advantageously, pursuant to a more particular feature of my invention, the temperature-control means comprises an array of Peltier elements disposed between the stage of the support and an underlying base. This array is preferably held, e.g. by cementing, in a horizontal frame having upper and lower projections which make limited contact with the stage and the base for minimizing heat transfer therebetween. The base may be provided with conduits for the circulation of a temperature-modifying fluid, e.g. water, serving to dissipate excess heat or to supplement the heating effect of the Peltier elements.

BRIEF DESCRIPTION OF THE DRAWING

The above and other features of my invention will now be described in detail with reference to the accompanying drawing in which:

FIG. 2 is a bottom view of the support shown in FIG. 1;

SPECIFIC DESCRIPTION

Figure 1:
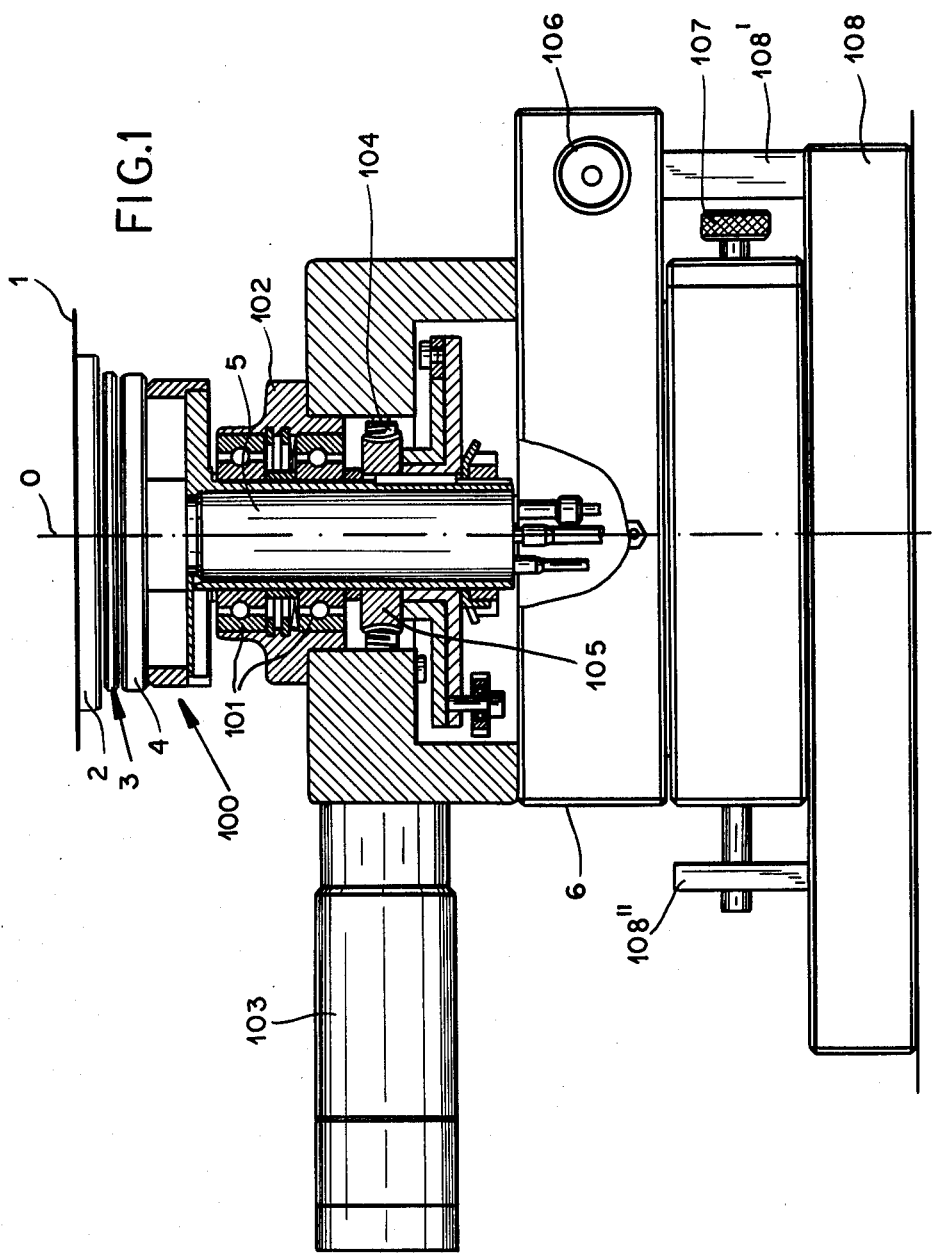
FIG. 1 is a side-elevational view, partly in section, of a wafer support embodying my invention.
Figure 3:
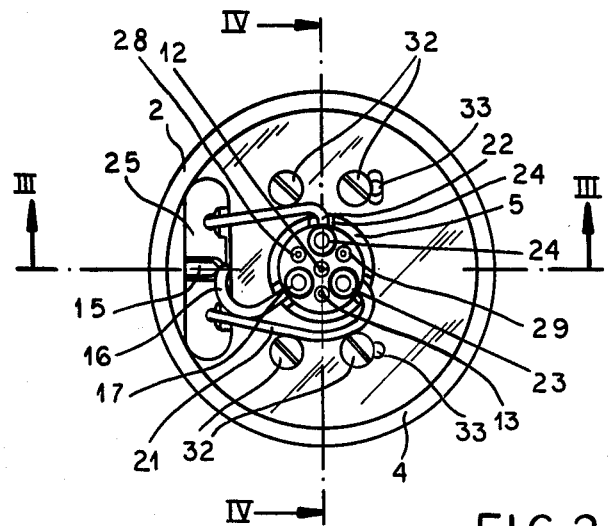
FIGS. 3 and 4 are cross-sectional views respectively taken along lines III—III and IV—IV of FIG. 2.
Figure 4:
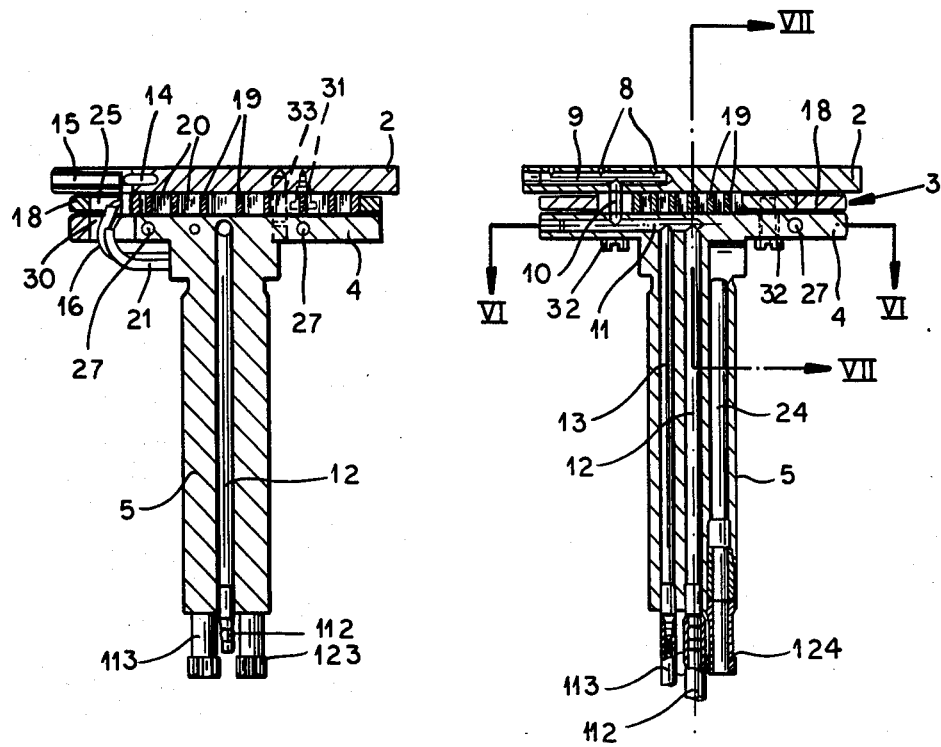
Figure 5:
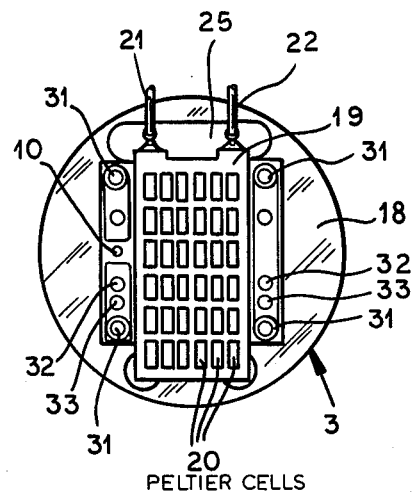
FIG. 5 is a bottom view of an array of Peltier cells included in the support.

FIG. 1 shows a wafer 1 supported on a stage 2 of a rotatable chuck, generally designated 100, which also comprises a base plate 4 separated from stage 2 by a temperature-controlling device 3 more fully described hereinafter. The assembly 2-4 is integral with a vertical shaft 5 which is journaled by bearings 101 in a housing 102 supporting a motor 103 while resting on two carriages 6, 7 displaceable in mutually orthogonal directions on a stationary foundation 108. Motor 103 drives a worm 104 in mesh with a worm wheel 105 on shaft 5 to enable a rotation of stage 2 about a vertical axis 0. Such rotation, along with the linear shiftability of the assembly in two horizontal directions by carriages 6 and 7, enables an initial orientation of the wafer or its final alignment with a mask by photoelectric means, as discussed above and as more fully described in my copending application whose disclosure is hereby incorporated by reference into the present one, depending on whether the wafer support of FIG. 1 forms part of a prepositioning station or of an exposure station. In a prepositioning station the shifting of carriages 6 and 7 may be accomplished manually, with the aid of respective knobs 106, 107 on leadscrews rotatably secured to foundation extensions 108' and 108", but could also be done automatically with the aid of servomotors responsive to signals from photocells illuminated by light rays which are reflected by markings on the wafer 1. In an exposure station the two-dimensional shifting will generally be automatic, with angular alignment preferably achieved by proper positioning of the photomask on its holder.

Figure 6:
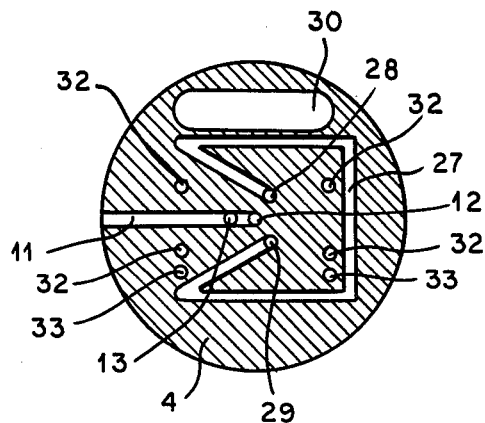
FIG. 6 is a sectional view taken on the line VI—VI of FIG. 4.
Figure 7:
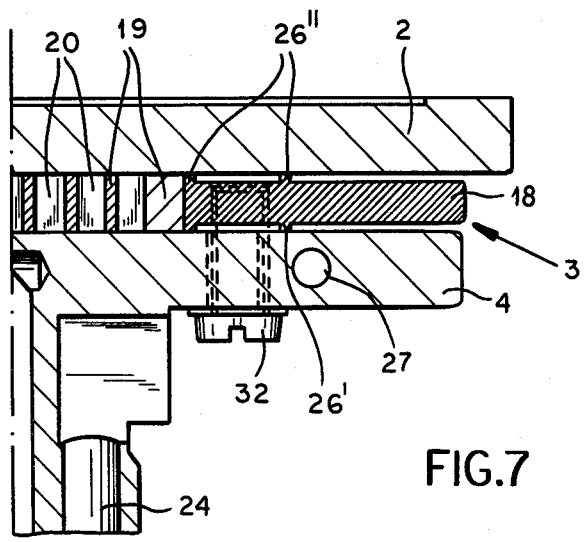
FIG. 7 is a fragmentary sectional view taken on the line VII—VII of FIG. 4 and drawn to a larger scale.

As more particularly illustrated in FIGS. 3-5 and 7, temperature-controlling device 3 comprises a rectangular array of Peltier elements or cells 20 assembled in a nonmetallic block 19 which is cemented or otherwise secured to a surrounding metallic frame 18. The latter has lower and upper ribs 26' and 26" making limited contact with the underlying base 4 and the overlying stage 2, respectively, in order to prevent any significant heat transfer therebetween. The Peltier cells 20 are connected in series between a pair of terminals tied to respective insulated wires 21 and 22 which pass through cutouts 25 and 30 in stage 2 and base 4 into channels 23 and 24 or shaft 5 terminating at binding posts 123 and 124. A nonillustrated power supply, e.g. a battery of 2 to 4 volts, can be connected to these binding posts by way of a reversing switch, also not shown, which enables the flow of direct current in one sense or the other through all the Peltier cells for the purpose of either heating or cooling the underisde of stage 2 carrying the wafer 1 (FIG. 1), depending on the polarity of the current. Also included in the supply circuit is a potentiometer thermoelectrically controlled, through a signal lead 16 traversing a channel 17 in shaft 5, by a temperature sensor 14, e.g. a thermistor, received in a radial bore of stage 2 which is closed by a grub screw 15; this enables an automatic stabilization of the wafer temperature at a predetermined level whose maintenance is further facilitated by circulation of a cooling fluid such as water through channels 27 of base 4 (best seen in FIG. 6) communicating with vertical bores 28 and 29 in shaft 5. Instead of carrying off excess heat, such a fluid could also be used as a supplemental heat source.

In this connection it is worth noting that a control of the wafer temperature can also be relied on to vary the magnification ratio of the projected mask image since the irradiated wafer will shrink or expand upon returning to normal temperature after exposure in a heated or cooled state. Thus, a temperature rise of 1° K. has been found to change the length of an edge of a silicon chip by 0.08μ for every 10 mm. The block 19 can therefore be used, with or without the assistance of a supplemental heating or cooling fluid, to change the dimensions of the oxide pattern to be produced or to compensate for changes in image size due to, say, a thermal expansion of the photomask or a lengthening of the column supporting that mask above the wafer surface; such compensation could be achieved by a control of the Peltier current in response to signals from further temperature sensors at the mask holder and at the column, e.g. as described hereinafter with reference to FIG. 8.

The upper surface of stage 2 has suction holes 8 opening into a channel 9 in that stage which communicates via a passage 10 with a similar channel 11 in base 4; the latter, in turn, is connected with two bores 12 and 13 in shaft 5. An extension 112 of the centrally disposed bore 12 leads to a nonillustrated vacuum pump designed to draw the overlying wafer 1 (FIG. 1) into firm contact with the supporting surface of stage 2; the magnitude of the suction created in bores 8 is determined by a pressure sensor, also not shown, connected to an extension 113 of bore 13.

The frame 18 is attached to stage 2 by a set of four screws 31 located near respective corners of block 19. After this connection has been established, the wafer-supporting surface of stage 2 is ground flat whereupon four other screws 32 offset from screws 31 are used to connect the frame to base 4. This avoids possible distortions of the stage surface during assembly. A precise relative angular positioning of the members of chuck 100 is further insured by locator pins 33 traversing the frame 18 and projecting into holes of stage 2 and base 4.

Figure 8:
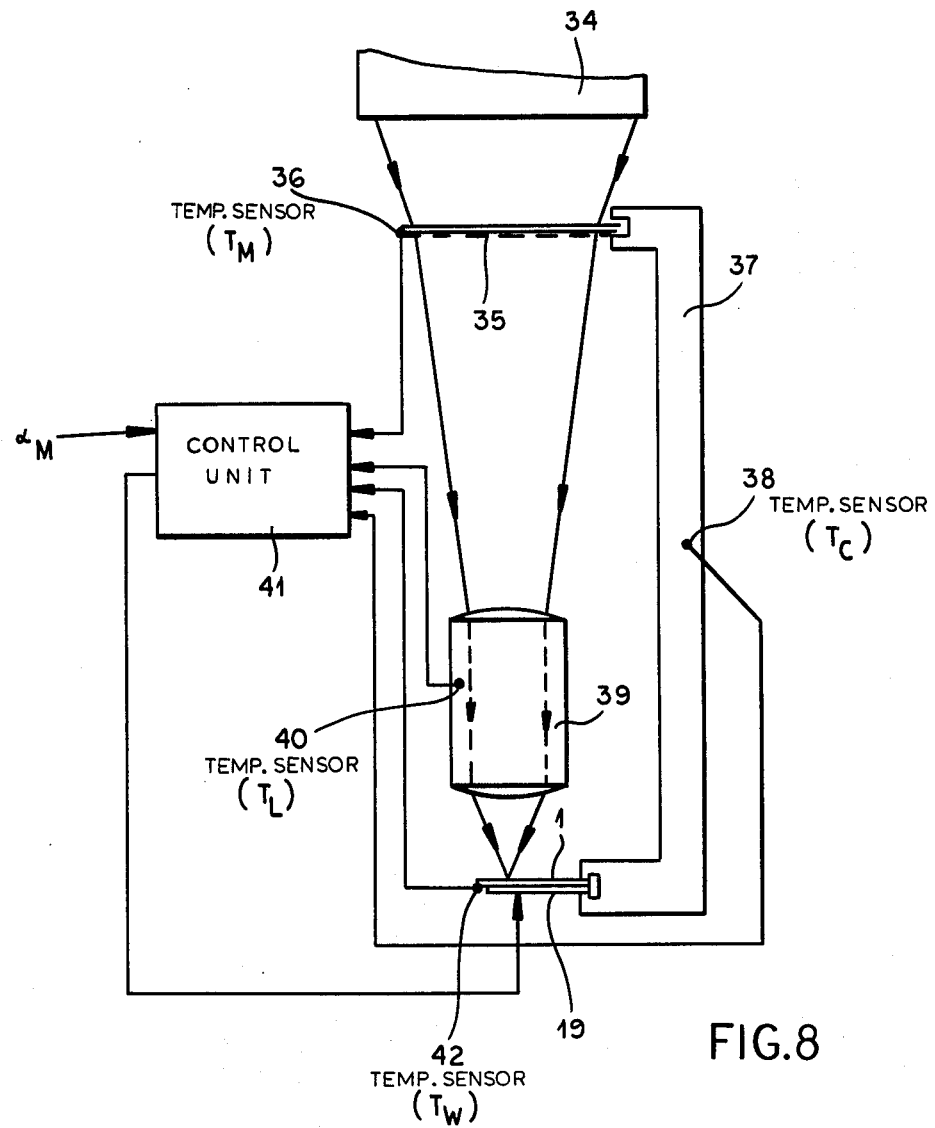
FIG. 8 shows schematically the use of the invention for magnification control.

FIG. 8 illustrates how the invention may be used for magnification control in an arrangement of the type proposed by Ernst W. Löbach at the aforementioned IGC conference.

The apparatus shown in FIG. 8 comprises a light source 34, illuminating a mask 35 and projecting its image via a lens system 39 onto the wafer 1. A column 37 determines the distance between the mask 35 and the wafer 1. Any change of the temperature of lens system 39 or of column 37 brings the wafer 1 out of focus, which is corrected automatically in conventional systems. The temperature changes of mask, column and lens system do, however, produce an additional change in image size which would prevent an exact matching of images projected in subsequent stages of the process.

The image size is nearly proportional to the mask temperature $T_M$ and inversely proportional to the column temperature $T_C$. Accordingly, if the thermal-expansion coefficients $\alpha_M$, $\alpha_C$ of the mask and the column are equal there is no change of the image size when there is temperature equilibrium $T = T_M = T_C$ as the lens is telecentric with respect to the image side. As $\alpha_M = \alpha_C$ is a technically realistic condition, one would have a perfect temperature compensation if the focal length f of the lens were not a complicated function of its temperature $T_L$.

Thus a computer-controlled temperature-compensation system for the magnification has to be employed. This system comprises a control unit 41 which receives information on the temperatures $T_M$, $T_C$, $T_L$ and $T_W$ of the mask, the column, the lens and the wafer from sensors 36, 38, 40 and 42, respectively, and adjusts the effective magnification by heating or cooling the wafer. The only addition input parameter the control unit needs is the coefficient $\alpha_M$.

According to my present invention, the necessary heating and cooling of the wafer is effected by using the control unit 41 to connect the Peltier-effect temperature-control means 19, 20 to the power supply thereof in a manner producing a current of the desired polarity.

I claim:

1. In an apparatus for exposing semiconductor wafers to exposure through a photomask, comprising a support having a stage with an upper surface onto which a wafer to be exposed is held by suction, said support being displaceable for imparting to said wafer a predetermined alignment position, the improvement wherein said support comprises temperature-sensing means adjacent said surface and Peltier-effect temperature-control means below said stage responsive to said temperature-sensing means for maintaining said wafer at a selected temperature level.

2. A support as defined in claim 1 wherein said temperature-control means comprises an array of Peltier elements disposed between said stage and an underlying base.

3. A support as defined in claim 2 wherein said array is held in a horizontal frame having upper and lower projections making limited contact with said stage and said base for minimizing heat transfer therebetween.

4. A support as defined in claim 3 wherein said base is provided with conduits for the circulation of a temperature-modifying fluid.

5. A support as defined in claim 3 or 4 wherein said temperature-sensing means is a thermoelectric device disposed in said stage, said base being apertured for the passage of conductors linking said thermoelectric device and said Peltier elements to a power supply.

6. A support as defined in claim 5 wherein said Peltier elements are serially connected across said power supply.

7. A support as defined in claim 6 wherein the connection of said Peltier elements to said power supply is controlled by a control unit which is connected to temperature sensors detecting the temperature of a photomask, of a lens projecting an image of said photomask on the wafer, of a column separating said wafer and said photomask, and of the wafer itself.

* * * * *

Dedication

4,432,635.—*Herbert E. Mayer*, Eschen, Liechtenstein. TEMPERATURE-CONTROLLED SUPPORT FOR SEMICONDUCTOR WAFER. Patent dated Feb. 21, 1984. Dedication filed Feb. 20, 1990, by the assignee, Mercotrust Aktiengesellschaft.

Hereby dedicates to the Public the remaining term of said patent.
[ *Official Gazette April 17, 1990* ]